(12) United States Patent
Higashi et al.

(10) Patent No.: US 6,354,480 B2
(45) Date of Patent: Mar. 12, 2002

(54) APPARATUS FOR POSITIONING A THIN PLATE

(75) Inventors: Mitsutoshi Higashi; Hiroko Koike, both of Nagano (JP)

(73) Assignee: Shinko Electric Industries, Co., Ltd, Nagano (JP)

( * ) Notice: Subject to any disclaimer, the term of this patent is extended or adjusted under 35 U.S.C. 154(b) by 0 days.

(21) Appl. No.: 09/778,119

(22) Filed: Feb. 5, 2001

(30) Foreign Application Priority Data

Feb. 14, 2000 (JP) ............................................ 12-034406

(51) Int. Cl.$^7$ ........................ B23Q 16/12; B23K 37/04; B23K 31/02
(52) U.S. Cl. ......................... 228/9; 228/49.5; 228/103
(58) Field of Search ................................ 228/103, 8, 9, 228/10, 49.1, 49.5; 414/935, 936

(56) References Cited

U.S. PATENT DOCUMENTS

| 5,242,103 A | * | 9/1993 | Denvir |
| 5,971,696 A | * | 10/1999 | Endo et al. |
| 5,982,132 A | * | 11/1999 | Colby |
| 6,085,967 A | * | 7/2000 | Grande et al. |
| 6,129,259 A | * | 10/2000 | Stansbury |
| 6,135,340 A | * | 10/2000 | Stansbury |
| 6,246,204 B1 | * | 6/2001 | Ebihara et al. |
| 6,275,742 B1 | * | 8/2001 | Sagues et al. |
| 6,279,815 B1 | * | 8/2001 | Correia et al. |
| 2001/0013532 A1 | * | 8/2001 | Higashi et al. |

FOREIGN PATENT DOCUMENTS

| JP | 1-9168 | | 3/1989 |
| JP | 404062944 A | * | 2/1992 |
| JP | A-4-74443 | | 3/1992 |

* cited by examiner

*Primary Examiner*—Tom Dunn
*Assistant Examiner*—Kiley Stoner
(74) *Attorney, Agent, or Firm*—Paul & Paul

(57) ABSTRACT

A positioning apparatus includes: a stage having a flat placement surface on which a thin plate is mounted. The placement surface has a flat region which is slightly larger than and completely covers that of said thin plate. The placement surface also has lateral side edges. An optical detecting means is arranged above the stage for detecting a mark provided on the thin plate and has such a view that the mark can be caught by the view if the thin plate placed on the placement surface is within the flat region, but the mark cannot be caught by the view if the thin plate placed on the placement surface protrudes by a part thereof from the region of the placement surface. A movable part pushes the thin plate until it comes into contact with the lateral edge to move the thin plate so that the thin plate is brought within the flat region of the placement surface.

6 Claims, 5 Drawing Sheets

APPARATUS FOR POSITIONING A THIN PLATE

BACKGROUND OF THE INVENTION

1. Field of the Invention

The present invention relates to an apparatus for positioning a thin plate and, more specifically, to an apparatus for detecting a mark provided at a predetermined position on a thin plate placed on a stage and positioning the thin plate in place.

2. Description of the Related Art

During the production of a semiconductor device, a flip-chip system can be adopted wherein electrode terminals of a semiconductor element are directly placed on a circuit board for forming a semiconductor device package. To adopt the flip-chip system, it is necessary to provide bumps on the respective electrode terminals to be in contact and connected with predetermined locations on the circuit board.

One method for forming such bumps is illustrated in FIG. 5. According to the bump-formation system shown in FIG. 5, after a semiconductor element 10 has been placed on a table 200 adapted to be movable in the horizontal direction so that electrode terminals 12 thereof are directed upward (see FIG. 5(a)), a gold bump 14 having a pointed distal end is formed on the respective electrode terminal 12, 12, . . . (see FIG. 5(b)).

This gold bump 14 is formed on the electrode terminal 12 by using a bonding device 40 shown in FIG. 6. In the bonding device 40, a tip end of a gold wire 44 wound on a wire spool 42 is heated, after passing through a clamper 46 and a capillary 48, to form a ball-like end 49. Thereafter, the capillary 48 descends to pressingly bond the ball-like end 49 onto the electrode terminal 12. Then, the gold wire 44 is stretchingly severed by means of the clamper 46 to form the gold bump 14 having a pointed tip end.

Such gold bumps 14, 14, . . . having the pointed ends are then subjected to a flattening treatment to be converted into bumps 16, 16, . . . having flat ends (see FIG. 5(c)).

In the bonding device 40 shown in FIG. 6, the semiconductor element 10 placed on the table 200 is initially detected and located (fixed) at a predetermined position since it is necessary to form the ball-like ends 49 of the gold wire 44 exactly above the electrode terminals 12, 12, . . . of the semiconductor element 10.

The electrode terminals 12, 12, . . . of the semiconductor element 10 detected and located on the table 200 are formed at predetermined positions on one surface of the semiconductor element 10. For this purpose, the semiconductor element 10 is movable by, for example, a controller (not shown) for controlling a drive means such as a servo-motor (not shown) for moving the table 200 in the horizontal direction so that a selected electrode terminal 12 on which the gold bump 14 is to be formed is positioned exactly beneath the ball-like end 49 of the gold wire 44.

In the prior art, the detection and positioning of the semiconductor element 10 placed on the table 200 are carried out by a positioning device shown in FIG. 7.

The positioning device shown in FIG. 7 includes the table 200 movable in the horizontal direction and having a suction hole 204 formed in a central region of the table 200 and fluidly connected to a vacuum generating means 202 such as a vacuum pump, four pusher members 100 provided so that a front end face of each thereof abuts to the respective side of the rectangular semiconductor element 10 and is movable to be away from and closer to the semiconductor element 10 to slide the semiconductor element 10 in the predetermined direction, a camera 50 such as a CCD for detecting marks provided at a selected position on the surface of the semiconductor element 10 placed on the table 200, and an optical detection means having a controller 52 for controlling a drive means (not shown) such as a servo-motor for moving the camera 50 leftward and rightward.

In the above-mentioned positioning device, the camera 50 has a high magnification to accurately detect the marks formed on one surface of the semiconductor element 10, which means that the camera 50 has a smaller field of view 54. Accordingly, as shown in FIG. 7, it is impossible to cover all of one surface of the semiconductor element 10 by the field of view 54 of the camera 50 but only part of the semiconductor element 10 can be covered.

If the marks 18, 18 provided on one surface of the semiconductor element 10 placed on the table 200 are out of the field of view 54 of the camera 50, as shown in FIG. 8(a), the respective pusher members 100 move to cause the front end faces thereof to abut to the four sides of the rectangular semiconductor element 10, respectively, in four directions, to slide the semiconductor element 10 on the table 200 so that the mark 18 of the semiconductor element 10 is within the field of view 54 of the camera 50 located at a fixed position, as shown in FIG. 8(b). Thus, the position of the semiconductor element 10 is easily detectable.

Then, the vacuum generating means 202 such as a vacuum pump is driven to secure the semiconductor element 10 thus detected on the table 200 through the suction hole 204, after which the table moves to the subsequent process.

According to the positioning device shown in FIG. 7, the front end faces of the pusher members 100 abut to sides of the semiconductor element 10, respectively, to slide the latter, as shown in FIGS. 7 and 8(b). Therefore, a pushing force applied to the semiconductor element 10 by the two pusher members 100 opposite to each other is liable to bend the semiconductor element 10.

Recently, the semiconductor element 10 has been made thinner; for example, in an extreme case, a thickness is less than 150 $\mu$m. Such a thin semiconductor element 10 may be bent due to a pushing force applied thereto while gripping the same between the front end faces of pusher members 100 disposed opposite to each other. In the semiconductor element 10 thus bent, even though the mark 18 is caught within the field of view of the camera 50, the position of the mark cannot be correctly detected.

Since the pusher members 100 must be in contact with and away from the semiconductor element 10 placed on the table 200, a predetermined gap is provided between the pusher member 100 and the table 200. There is a risk in that the thin semiconductor element 10 may slide into the gap 102.

Another prior art related to the present invention is disclosed in Japanese Examined Utility Model Publication No. 1-9168 wherein stopper portions are provided at opposite corners of a positioning stage, and position-restricting surfaces corresponding to outer sides of leads of a workpiece and contact surfaces to abut to the stopper portions are provided in pusher members, wherein the positional relationship between the position-restricting surfaces, the stopper portions and the contact surfaces is so selected that a sum of gaps between the position-restricting surfaces and the outer sides of the leads of the workpiece is equal to a predetermined value when the pusher members reach their foremost positions.

Also, in Japanese Unexamined Patent Publication No. 4-74443, a die-bonding device is disclosed, wherein a semiconductor chip is located on a positioning stage by a positioning member, then moves to a bonding position on a body to be bonded by means of a bonding head and is bonded onto the body. In this prior art, a protrusion is formed in a central region of the positioning stage, having a size smaller than the semiconductor chip. According to this device, any debris generated from the semiconductor chip during the positioning operation is not left on the stage surface on which the positioning of the semiconductor is carried out, whereby the positioning member can assuredly be brought into contact with the semiconductor chip every time to accurately locate the latter at a predetermined position.

SUMMARY OF THE INVENTION

Accordingly, an object of the present invention is to provide an apparatus for positioning a thin plate placed on a table, by slide means such as pusher members, which is free from a risk of bending the thin plate due to a pushing force applied thereto by the slide means while gripping the thin plate between front end faces of the slide means.

The inventors have studied to solve the above-mentioned problem in the prior art and found that it is possible to adjust a position of a thin plate without applying a large pushing force which can bend the thin plate by a slide means, by forming a stage on a table for placing the thin plate such as a semiconductor element. The stage has a flat placement surface for placing the thin plate thereon having such an area that when the thin plate is placed on the placement surface without projecting out therefrom, a mark formed on one surface of the thin plate is always caught within a field of view of a camera. The slide means is adapted to sliding the thin sheet placed on the placement surface of the stage to move the projected part of the thin plate into the area of the placement surface, so that a front end face of the slide means abuts to a lateral side of the stage.

According to the present invention, there is provided an apparatus for positioning a thin plate comprising: a stage having a flat placement surface on which said thin plate is mounted, said placement surface having a flat region which is slightly larger than, and completely covers, said thin plate, said placement surface also having at least one lateral side edge; optical detecting means arranged above said stage for detecting a mark provided on said thin plate, said optical detecting means having such a view that said mark can be caught by said view if said thin plate placed on said placement surface is within said flat region of the placement surface, but said mark cannot be caught by said view if said thin plate placed on said placement surface protrudes by a part thereof from said flat region of the placement surface; and adjusting means having a movable part which pushes said thin plate until it comes into contact with said lateral edge to move said thin plate so that said thin plate is brought within said flat region of the placement surface.

The flat placement surface is an upwardly protruded portion from a lower flat surface of a table and said movable part of the adjusting means is a pusher member which slidingly moves on said lower flat surface.

According to the present invention, if the thin plate slide means includes a pusher member having a front end face movable to be in contact with or move away from the lateral side of the stage on the table, the slide means becomes simple in structure.

If the means for fixing the thin plate at a predetermined position has a plurality of suction holes opened on the placement surface, the thin plate can be sucked by a plurality of positions whereby the deformation thereof is avoidable.

Further, the present invention is suitably applicable to a semiconductor element 150 μm thick or less.

According to the apparatus for positioning the thin plate of the present invention, since the placement surface of the stage is flat and larger than the thin plate, there is no risk in that the thin plate is fixed between the front end faces of the slide means when the projected part of the thin plate placed on the placement surface of the stage formed on one side of the table slides into the area of the placement surface, whereby the bending of the thin plate due to the pushing force is avoidable.

Also, the placement surface has such an area that when the thin plate is placed on the placement surface without projecting outside thereof, the mark on the thin plate is always caught in the field of view of the camera. Thus, when the thin plate is completely placed on the placement surface of the stage by sliding the projected part of the thin plate into the placement surface by the slide means, the mark is also within the field of view of the camera, whereby the position of the thin plate is easily detectable.

Also, the thin plate thus position-detected is fixed on the stage by the fixing means to complete the positioning operation.

DETAILED DESCRIPTION OF THE PREFERRED EMBODIMENTS

Figure 1:
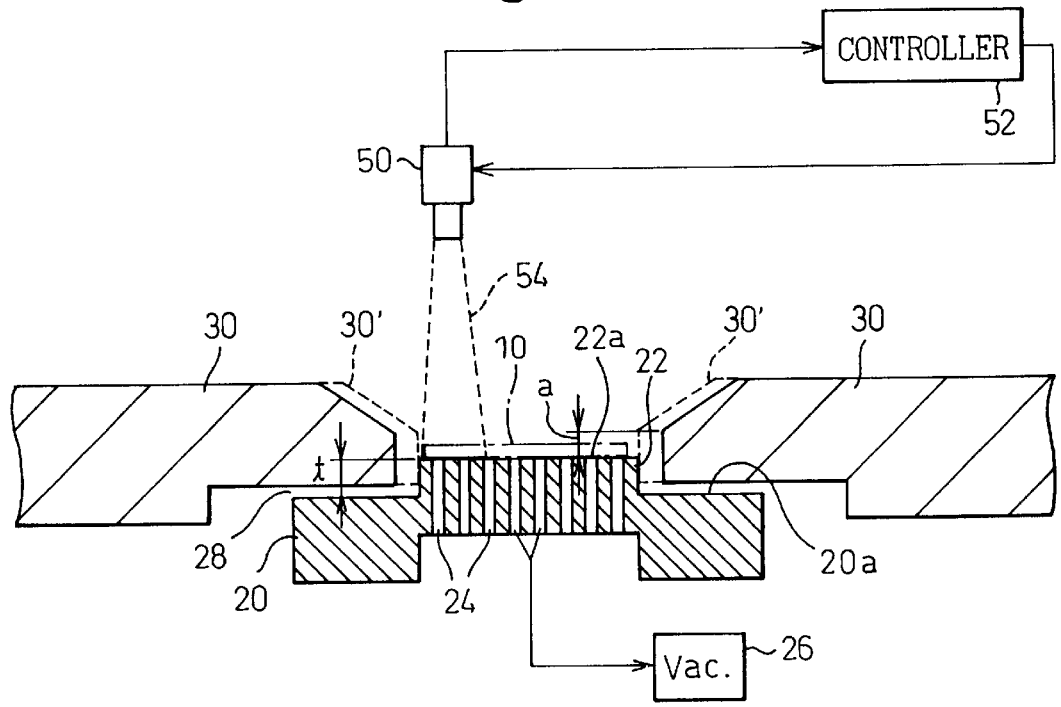
FIG. 1 is a schematic partially sectional view of one embodiment of an apparatus for positioning a thin plate according to the present invention.
Figure 2:
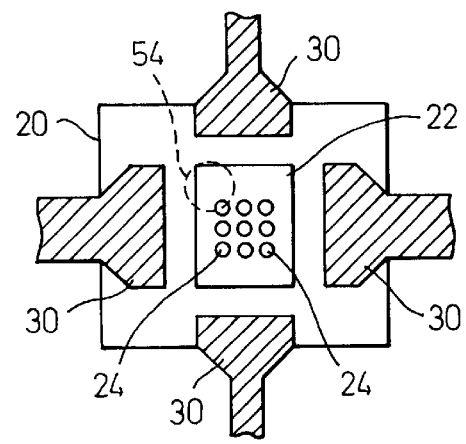
FIG. 2 is a schematic plan view of part of the thin plate positioning apparatus shown in FIG. 1.

An apparatus for positioning a thin plate, such as a semiconductor element shown in FIGS. 1 and 2, includes a table 20 movable in the horizontal direction. In a central region of one surface of the table 20, a stage 22 having a rectangular placement surface 22a is formed in a protruded state for placing a semiconductor element 10 thereon. The flat placement surface 22a is higher by a dimension "t" from the upper surface 20a of the table 20. A plurality of suction holes 24 are open on the placement surface of the stage 22 and coupled to a vacuum generating means 26 such as a vacuum pump.

Pusher members 30 are provided at the respective lateral sides of the stage 22 so that front end faces thereof are slidingly moved on the upper surface 20a of the table 20 to be in contact with and away from the lateral sides of the stage 22, respectively. An upper portion of the front end face of the pusher member 30 is formed to be higher by a dimension "a" than the placement surface of the stage 22 so that it abuts to a projected part of the semiconductor element 10 to slide the semiconductor element 10 along and into the placement surface 22a.

Above the placement surface 22a of the stage 22, there is provided a camera 50, such as a CCD camera, for detecting marks formed at predetermined positions on an upper side of the semiconductor element 10 placed on the placement surface 22a, which constitutes an optical detection means in association with a controller 52 for controlling means (not shown) for driving the camera 50 to move leftward and rightward.

The placement surface 22a of the stage 22 shown in FIG. 1 is flat and formed to be slightly broader than the semiconductor element 10 placed thereon, and completely covers the flat region of the semiconductor element 10. In addition, the placement surface 22a has such an area that the marks formed on the one side of the semiconductor element 10 are always present within the field of view of the camera 50 when the semiconductor element 10 is placed on the placement surface 22a without being projected outside thereof. In other words, when the semiconductor element 10 is completely placed on the placement surface 22a of the stage 22 after part of the semiconductor element 10 projected therefrom has been slid toward the stage 22, the mark formed on the one side of the semiconductor element 10 can be positioned within the field of view 54 of the camera 50.

The width of the front end face of the respective pusher member 30 is substantially the same or a little smaller than the length of the corresponding lateral side of the stage 22.

Figure 3A:
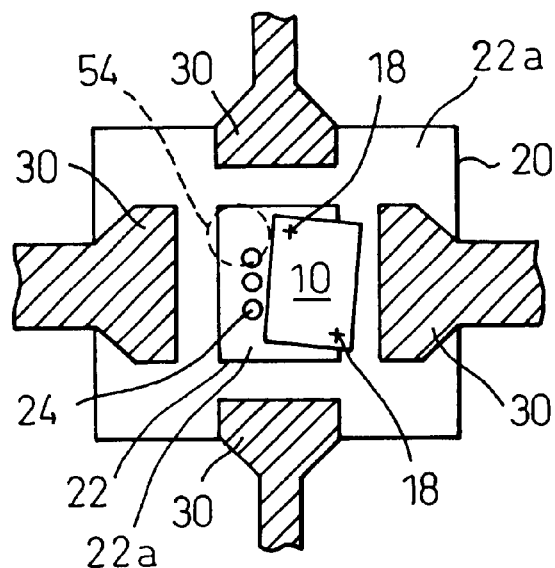
FIGS. 3(a) and 3(b) illustrate the operation of the thin plate positioning apparatus shown in FIGS. 1 and 2.
Figure 3B:
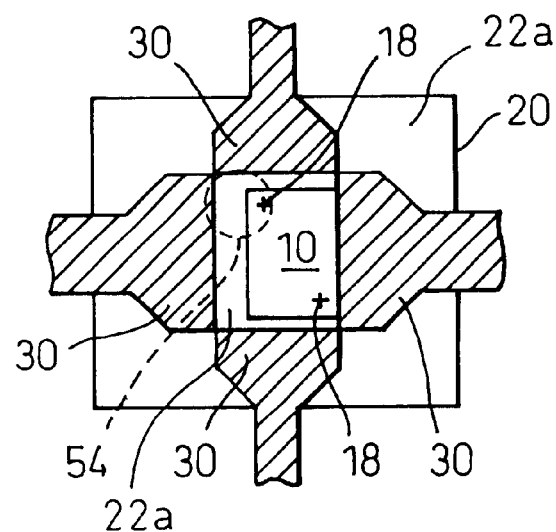

The operation will be illustrated, in FIGS. 3(a) and 3(b), for sliding the semiconductor element 10 by the pusher members 30 to move the projected part of the semiconductor element toward the stage 22 to be correctly placed thereon. As shown in FIG. 3(a), if the semiconductor element 10 is placed on the stage 22 with part thereof projected from the placement surface, the marks 18 of the semiconductor element 10 are out of the field of view 54 of the camera 50.

To correct the same, the four pusher members 30 arranged to encircle the stage 22 are driven to slidingly move on the upper surface 20a of the table 20 toward the stage 22, whereby the projected part of the semiconductor element 10 moves onto the placement surface 22a by the contact of the front end face of the pusher member 30 in contact therewith.

When the lower portions of the front end faces of the respective pusher members 30 abut to the lateral sides of the stage 30, as the pusher members 30' shown in FIG. 1, the slide motion of the semiconductor element 10 has completed, and the semiconductor element 10 is placed on the placement surface of the stage 22 without being projected out thereof as shown in FIG. 3(b). In the state shown in FIG. 3(b), one of the marks 18 formed on the semiconductor element 10 is within the field of view 54 of the camera 50. As mentioned above, the area of the placement surface 22a of the stage 22 is formed slightly broader than that of the semiconductor element 10 so that one of the marks 18 formed on one side of the semiconductor element is always within the field of view 54 of the camera 50.

The sliding motion of the semiconductor element 10 toward the placement surface 22a by the action of the upper portion of the front end face of the pusher member 30 is completed when the lower portion of the front end face of the pusher member 30 abuts to the lateral side of the stage 22. At the same time, the upper portion of the front end face of the pusher member 30 abuts to the lateral side of the stage 22 to stop its motion toward the stage 22.

On the other hand, since the placement surface 22a of the semiconductor element 10 is formed broader than the semiconductor element 10, no force is applied from the pusher member 30 to the semiconductor element 10 correctly placed on the placement surface 22a of the stage 22 without being projected out thereof. Thus, it is possible to prevent the bending force from being applied to the semiconductor element 10 due to the grip ping thereof between the opposite front end faces of the pusher members 30. Accordingly, the bending of the semiconductor element 10 is avoidable even if it is as thin as 150 µm or less.

Since the semiconductor element 10 is placed on the placement surface of the stage 22 protruded upward from the table 20, there is no risk in that the semiconductor element 10 enters into a gap 28 (see FIG. 1) between the table 20 and the pusher member 30 even if the semiconductor element 10 is as thin as 150 µm or less or, particularly, 100 µm or less.

As shown in FIG. 3(b), if one of the marks 18 is within the field of view 54 of the camera 50, it is possible to move the camera 50 by means for moving the camera 50 to locate the mark 18 at a center of the field of view 54 and correctly detect the position thereof.

The position of the semiconductor element 10 is determined by detecting the positions of the marks 18. Since the positions of the marks 18 are preliminarily known, if one of them is detected, the other is easily detectable.

Figure 7:
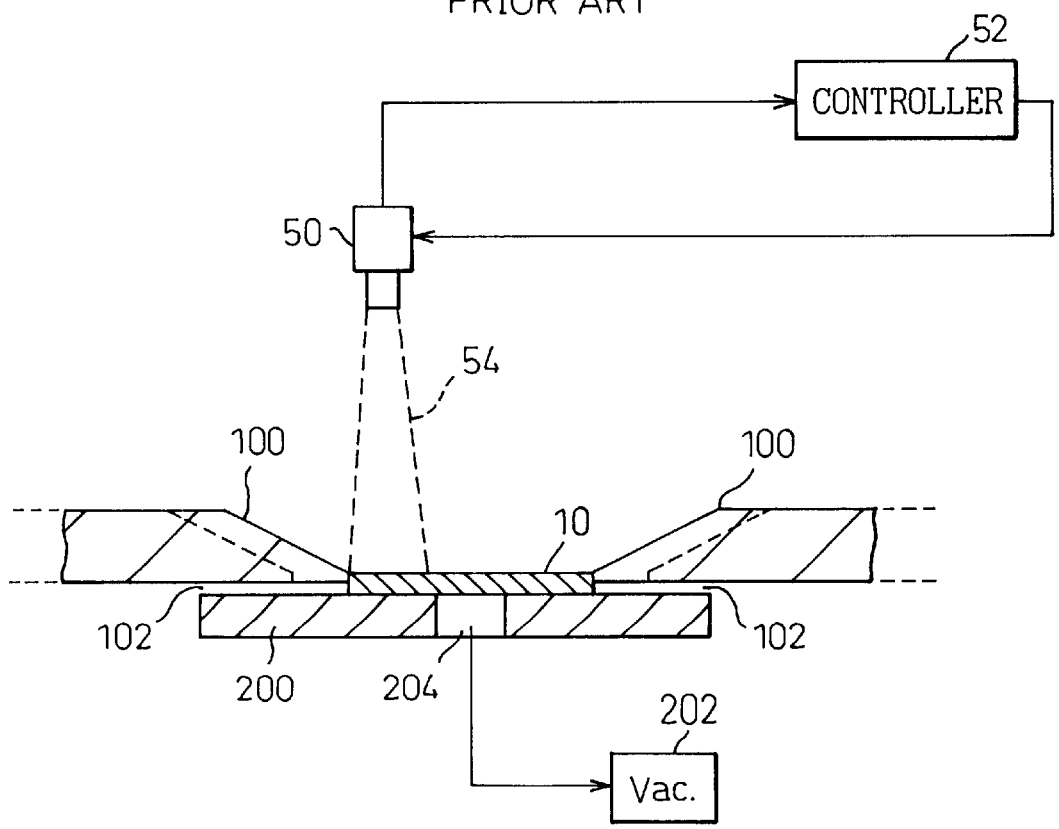
FIG. 7 is a schematic partially sectional view of a prior art thin plate positioning apparatus.
Figure 8A:
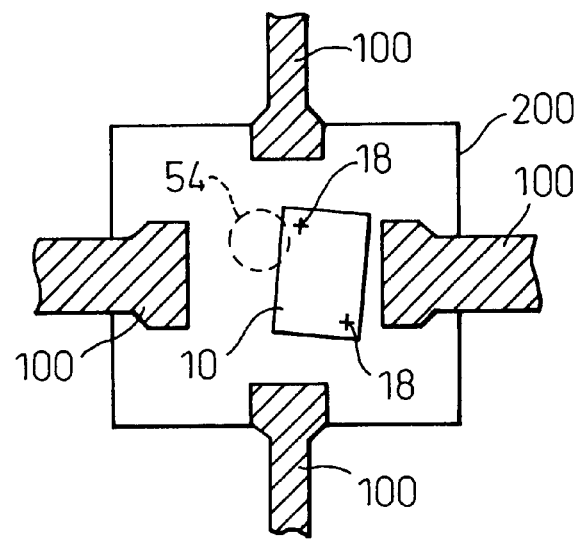
FIGS. 8(a) and 8(b) illustrate the operation of the thin plate positioning apparatus shown in FIG. 7.
Figure 8B:
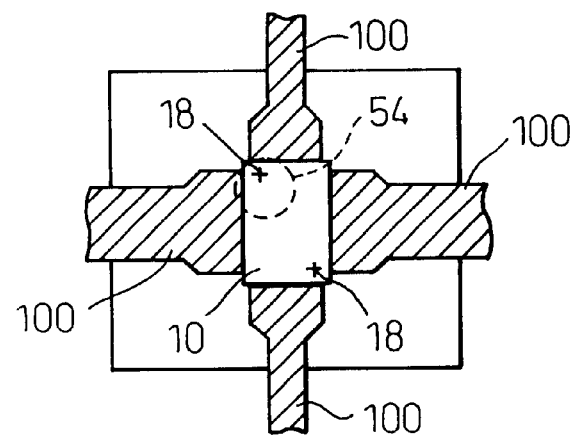

When the position of the semiconductor element 10 placed on the placement surface 22a of the stage 22 has been detected in such a manner, the vacuum generating means 26 such as a vacuum pump is driven to evacuate the plurality of suction holes 24 so that the semiconductor element 10 is fixed to the placement surface 22a of the stage 22. By fixing the semiconductor element 10 by suction through the plurality of suction holes 24, it is possible to minimize an opening area per one suction hole 24 in comparison with the prior art shown in FIG. 7 wherein only one suction hole 204 is provided. Thereby, the semiconductor element 10 is prevented from being deformed due to suction, even though it is as thin as 150 µm or less.

Figure 6:
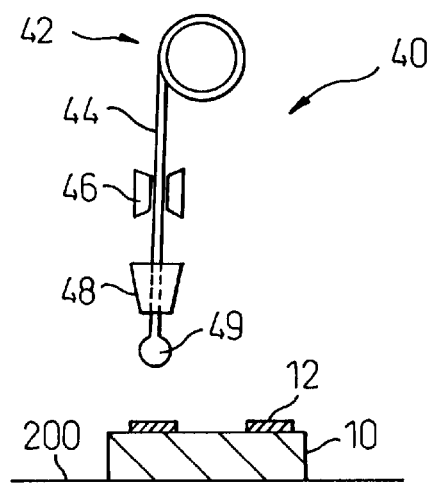
FIG. 6 is a schematic view of a bonding device used for forming bumps in electrode terminals of a semiconductor element.

In this regard, the semiconductor element 10 suckingly fixed to the placement surface of the stage 22 is moved together with the table 20 while fixed to the stage 22 to a subsequent process such as that for the formation of bumps by a bonding device 40 shown in FIG. 6.

Figure 4:
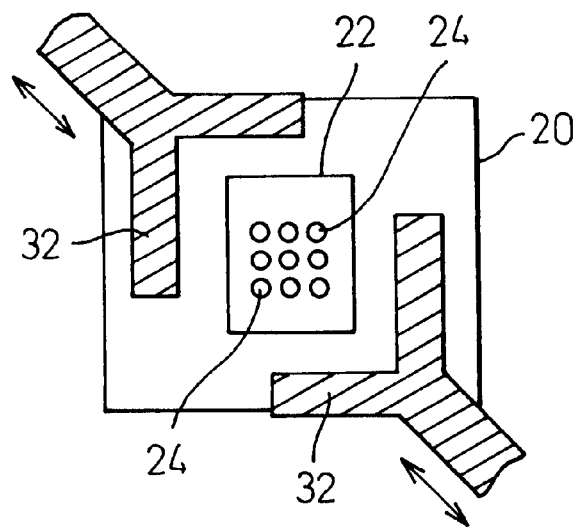
FIG. 4 is a schematic plan view of an embodiment of the thin plate positioning apparatus other than that shown in FIGS. 1 and 2.
Figure 5A:
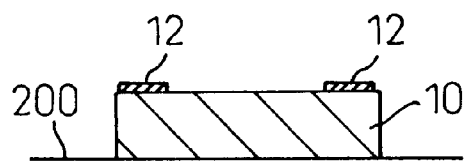
FIGS. 5(a), 5(b) and 5(c) illustrate the operation for forming bumps in electrode terminals of a semiconductor element.
Figure 5B:
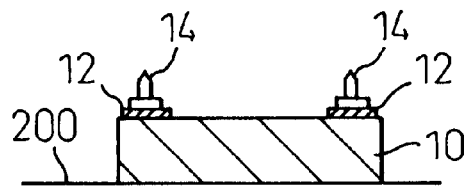
Figure 5C:
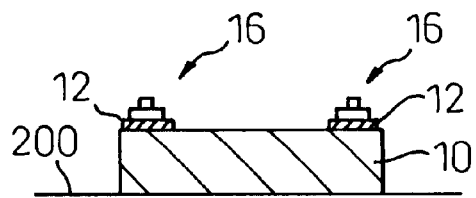

While the four pusher members 30 are provided in correspondence to the respective lateral sides of the rectangular stage 22 in the embodiment shown in FIGS. 1 to 3 described above, a pair of L-shaped pusher members 32 may be provided to be in contact with and away from the respective sides of the stage 22 as shown in FIG. 4.

Also, instead of the semiconductor element 10 used in the embodiment shown in FIGS. 1 to 3, other thin plates may be used such as a ceramic substrate.

According to the apparatus for positioning a thin plate, it is possible to position the thin plate while preventing it from entering a gap between a table and a slide means or from bending by the operation of the slide means, so that the position of the thin plate is easily detectable by an optical detection device.

As a result, the thin plate fixed onto the table by the fixing means is quickly movable to a subsequent process to be subjected to a desired treatment.

It should be understood by those skilled in the art that the foregoing description relates to only some preferred embodiments of the disclosed invention, and that various changes and modifications may be made to the invention without departing from the spirit and scope thereof.

What is claimed is:

1. An apparatus for positioning a thin plate comprising:

a stage having a flat placement surface on which said thin plate is mounted, said placement surface having a flat region which is slightly larger than and completely covers that of said thin plate, said placement surface also having at least one lateral side edge;

optical detecting means arranged above said stage for detecting a mark provided on said thin plate, said optical detecting means having such a view that said mark can be caught by said view if said thin plate placed on said placement surface is within said flat region of the placement surface, but said mark cannot be caught by said view if said thin plate placed on said placement surface protrudes by a part thereof from said flat region of the placement surface; and adjusting means having a movable part which pushes said thin plate until it comes into contact with said lateral edge to move said thin plate so that said thin plate is brought within said flat region of the placement surface.

2. An apparatus as set forth in claim 1 further comprising a holding means for fixedly holding said thin plate at position on said placement surface, said holding means comprising a plurality of holes provided on said flat placement surface of the stage connected to vacuum suction means.

3. An apparatus as set forth in claim 1, wherein said thin plate is a semiconductor element having a thickness of not more than 150 $\mu$m.

4. An apparatus as set forth in claim 1, wherein said stage has said flat placement surface which is an upwardly protruded portion from a lower flat surface of a table, and said movable part of the adjusting means is a pusher member which slidingly moves on said lower flat surface.

5. An apparatus as set forth in claim 4, wherein said placement surface of the stage has a rectangular shape and has four lateral side edges, and said adjusting means has four pusher members which slidingly move on said lower flat surface until they come into contact with said respective lateral sides of the stage to move said thin plate so that said thin plate is brought within said flat region of the placement surface.

6. An apparatus as set forth in claim 5, wherein said pusher members comprises a pair of L-shaped pusher members which slidingly move on said lower flat surface until they come into contact with the adjacent lateral sides of the state.

* * * * *